(12) United States Patent
Yamakawa et al.

(10) Patent No.: US 6,243,259 B1
(45) Date of Patent: Jun. 5, 2001

(54) ELECTRONIC MEMBER AND ELECTRONIC DEVICE

(75) Inventors: Eiji Yamakawa; Mitsuo Matsunaga, both of Ome (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/097,552

(22) Filed: Jun. 15, 1998

(30) Foreign Application Priority Data

Jun. 20, 1997 (JP) .................................................. 9-164444

(51) Int. Cl.$^7$ ........................................................ G06F 1/16

(52) U.S. Cl. ........................... 361/681; 361/681; 361/736; 361/752; 361/772; 368/84

(58) Field of Search ................................. 368/84; 362/23; D10/30, 132; 968/950, 962, 958; 361/681, 736, 752, 772

(56) References Cited

U.S. PATENT DOCUMENTS 4,208,869 * 6/1980 Hanaoka .................................. 368/84

\* cited by examiner

*Primary Examiner*—Leo P. Picard
*Assistant Examiner*—Yean-Hsi Chang
(74) *Attorney, Agent, or Firm*—Frishauf, Holtz, Goodman, Langer & Chick, P.C.

(57) ABSTRACT

The invention relates to a plate-like electronic member, e.g., an electro luminescence element or the like, and an electronic device. In the electronic member (1) of the invention, first and second electrodes are formed on respective surface of a plate-like electronic member body a first electrode connecting portion is formed on the first electrode, and, a second electrode connecting portion which is electrically connected with the second electrode is formed on a same side of the first electrode as the first electrode connecting portion with an insulating layer disposed between the second electrode connecting portion and the first electrode. The electronic device according to the invention comprises the electronic member (1) and an apparatus case (15) having the electronic member built-in.

3 Claims, 12 Drawing Sheets

ELECTRONIC MEMBER AND ELECTRONIC DEVICE

BACKGROUND OF THE INVENTION

1. Field of the Invention

The present invention relates to a plate-like electronic member and an electronic device, for example, an electro luminescence element or the like, and to a watch using the same.

2. Description of the Related Art

An electronic apparatus, e.g., an electronic watch, an electronic pocket notebook or the like, having a plate-like luminescent element (hereinafter, which may be simply referred to as an "EL") such as an electro luminescence element or the like, which is incorporated therein as an electronic member, instead of a lump or the like, in order to prevent the whole apparatus case of the electronic apparatus from thickening and to enable sufficient visual recognition of information even in total darkness by illuminating various types of information, e.g., characters, signs, images and the like, which are displayed on a display panel provided at an upper position thereof, has been developed.

An EL as a conventional electronic member is formed in plate-like shape as a whole of an EL body in which a front electrode, a luminescent layer, an insulating layer and a back electrode are layered in order. The front electrode and the back electrode are layered so that they put the luminescent layer between them and make the luminescent layer emit light by supplying supplied electric power to the luminescent layer.

For that, two electrode connecting portions are connected with the electrodes to supply the electric power. A back electrode connecting portion which supplies electric power to the back electrode, among two electrode connecting portions are provided in the back surface of plate-like EL body, while a front electrode connecting portion which supplies electric power to the front electrode is provided in the front surface of plate-like EL body. The back electrode surface of the electrode connecting portions is exposed to perform the function of a connecting face.

In this case, since the back electrode connecting portion is layered on the back electrode, it is placed in the region of the EL in plan, while the front electrode connecting portion is layered on an extended portion formed by extending the front electrode outwardly. The reason for this is that since the back electrode is covered by the insulating layer, it is necessary to connect the front electrode connecting portion with the circuit board or the like at a position outside the insulating layer. As the result, the front electrode connecting portion is positioned outside the region of the EL in plan to be used for connection outside the region.

Although such a conventional plate-like electronic member, e.g., an EL or the like can carry out a predetermined operation without thickening the case of the electronic apparatus, since the front electrode connecting portion is positioned outside the electronic member, a large external shape is required, as described above. Therefore, because it is necessary to make the space for the front electrode connecting portion in the electronic apparatus and to enlarge the apparatus case for containing the electronic member, there is a problem that the electronic apparatus cannot be miniaturized.

The electronic member, e.g., the EL, the liquid crystal display panel or the like are connected with a circuit board through connecting members such as a coil, an interconnector and the like, generally. Although the connection between the electronic member and the circuit board is carried out by providing the connecting members between them, when the space between the electronic member and the circuit board is narrow, it becomes difficult to incorporate the connecting member between them and the attachment work becomes complicated. Therefore, because it is necessary to keep a space between the electronic member and the circuit board to some extent, there is a problem of difficulty of thinning the electronic apparatus.

SUMMARY OF THE INVENTION

The present invention has been developed in view of these conventional problems.

An object of the present invention is to provide an electronic member which enables a small-sized external form and which enables miniaturization and lightening of the electronic apparatus as a whole, and an electronic device using the same, such as an electronic watch and the like.

Another object of the present invention is to provide an electronic member and an electronic device, which enable thinning of an electronic apparatus, such as an electronic watch and the like.

In order to solve the above objects, in accordance with one aspect of the invention, an electronic member comprises: a plate-like electronic member body; a pair of first and second electrodes which are formed on first and second surfaces of the electronic member body, respectively; a pair of first and second electrode connecting portions which are disposed on same side of the first electrode and which are electrically connected with the pair of first and second electrodes, respectively, wherein the second electrode connecting portion is formed above the first electrode with an insulating layer disposed therebetween.

According to the electronic member of the invention, although the second electrode connecting portion is disposed above the first electrode surface, it is connected with the second electrode without electrically contacting with the first electrode, because the second electrode connecting portion is insulated from the first electrode by the insulation layer. As the result, not only the first electrode connecting portion which is connected with the first electrode, but also the second electrode connecting portion which is connected with the second electrode, are disposed above the first electrode, so that the second electrode connecting portion is not positioned outside the region of the first electrode in plan and the size of the external shape of the electronic member becomes small. Therefore, because the apparatus case for incorporating the electronic member can be small-sized sufficiently, the electrical apparatus can be also miniaturized sufficiently.

Another electronic device comprises a case having the electronic member built-in.

According to the electronic device, e.g., an electronic watch, because the size of the external shape of the above-described electronic member is small, it is possible to make the external shape of the entirety of its case, (which has the electrode member built-in) sufficiently small to miniaturize the electronic device such as an electronic watch.

The electrode member may have such a structure that one or both of the first and second electrodes is divided into a plurality of electrode portions and an electrode connecting portion is provided for each divided electrode portion.

When an electric power is supplied to each of the divided plurality of electrode portions and output operation, e.g., luminescence, display or the like are carried out independently through each of the divided electrode portions, it is possible to carry out complicated output operations without enlarging the size of electronic member.

The electrode member may have such a structure that the electronic member body comprises one selected from the group consisting of a luminescent element for luminescence, a liquid crystal display element for display and a photoelectric converting element for photoelectric conversion.

According to the electronic member, because the electronic member body comprises a luminescent element, a liquid crystal display element or a photoelectric conversion element, it is possible to carry out luminescence, display or photoelectric conversion.

In accordance with another aspect of the invention, an electronic device comprises: a circuit board having an electrically connecting portion; an electronic member which is arranged to face the circuit board and which has an electrode formed at a position corresponding to the connecting portion; and a conductive projecting portion which is formed on at least one of the electrode of the electronic member and the connecting portion of the circuit board, to electrically connect the electrode of the electronic member with the connecting portion of the circuit board.

According to the electronic device, because the conductive projecting portion is formed on the electronic member or the circuit board in advance, the conductive projecting portion necessarily exists between them and can operate to electrically connect the electronic member with the circuit board, by connecting the electronic member to the circuit board. Therefore, because it is not necessary to incorporate another connecting member, for example, a coil, an interconnector or the like between the electronic member and the circuit board, no complicated work for attachment of the connecting member is needed, so that the electronic member and the circuit board can be combined easily.

Because no connecting member is needed, it is not necessary to have a space for incorporating the connecting member between the electronic member and the circuit board. Therefore, the electronic member can be positioned as close as possible to the circuit board, and it is possible to miniaturize and to thin the electronic device.

An electronic device may comprise the above-described electronic member and a display device provided above the electronic member.

According to the electronic device, because the electronic device comprises the display device, the electronic device can achieve a display function.

In accordance with a further aspect of the invention, an electronic device comprises: an electronic member comprising a plate-like electronic member body, a pair of first and second electrodes which are formed on front and back surfaces of the electronic member body, and a pair of first and second electrode connecting portions which are disposed on a same side of the first electrode between the pair of first and second electrode and which are electrically connected with the pair of first and second electrodes, respectively, wherein the second electrode connecting portion is formed above the first electrode with an insulating layer disposed therebetween; a circuit board which is disposed to face the electronic member and has a pair of terminal portions formed to face the pair of electrode connecting portions; and conductive projecting portions which are formed on at least one of the electrode connecting portions of the electronic member and the terminal portions of the circuit board respectively, to electrically connect the electrode connecting portions with the terminal portions.

According to such a electronic device, the electrode connecting portions of the electronic member are not positioned outside the region of the first electrode in plan so that the electronic member can be miniaturized. Because the electronic member is connected with the circuit board through the conductive projecting portions, no other connecting portion, for example, a coil, an interconnector or the like is needed and, it is possible to combine the electronic member and the circuit board easily, and to miniaturize and thin the electronic device.

In such a case, an electronic apparatus such as an electronic watch or the like may comprise a case complete having the above-described electronic device built-in.

Because the miniaturized and thinned electronic device is incorporated, it is possible to obtain a miniaturized and thinned electronic apparatus, e.g., an electronic watch or the like.

In the electronic device, the conductive projecting portions may be formed in a predetermined space formed between the electronic member and the circuit board.

According to the electronic device having such a structure, because the projecting portions are provided in the space, no other member such as a spacer or the like, for preventing direct contact between the electronic member and the circuit board is needed, and it is possible to combine the electronic member and the circuit board easily.

In the electronic device having such a structure, the conductive projecting portions may be formed by one selected from the group of methods consisting of printing, dropping, seizing and adhering.

According to these methods, it is possible to manufacture the conductive projecting portion easily, consequently, the electronic device also can be manufactured easily.

In the electronic device, the conductive projecting portions may be formed on the electrode connecting portions of the electrode member or on the terminal portions of the circuit board, through a conductive sheet or an anisotropy sheet.

The conductive projecting portions are attached to the electronic member or the circuit board, through the conductive sheet or the anisotropy sheet, after the conductive projecting portions are formed in advance. And the conductive projecting portions are brought into electrical contact with the electrodes or the terminal portions, because the conductive projecting portions are incorporated through the conductive sheet or the anisotropy sheet, which have conductivity.

In the electronic device, the electronic member may comprise one selected from the group consisting of a luminescent member, a liquid crystal display member and a photoelectric converting member.

By selecting any one of a luminescent member, a liquid crystal display member and a photoelectric converting member as the electronic member, each function can be given to the electronic device.

As described above, according to the electronic member of the invention, because by disposing the entirety of the first and second electrodes connecting portions on or above one electrode surface, the electrode connecting portions do not extend out of the region of the electronic member body in plan and, it is possible to miniaturize the electronic member as a whole. Therefore, it is possible to miniaturize also the electronic apparatus in which the electronic member is incorporated.

According to the electronic device of the invention, because the conductive projecting portions having an adjustable height is provided on at least one of the electrodes of the electronic member and the terminal portions of the circuit board to connect the electrodes and the terminal portions, no other connecting member such a coil, an interconnector or the like to connect the electronic member with the circuit board is required. As the result, it is possible not only to simplify the structure of the electronic device and to easily connect the electronic member with the circuit board, but also to bring near the electronic member and the circuit board, since no space for incorporating the connecting member is required. Therefore, it is possible to thin the electronic device as a whole.

According to the electronic apparatus, e.g., an electronic watch, of the invention, because the electronic member or the electronic device, above-described is disposed in the case it is possible to miniaturize and thin the electronic apparatus.

PREFERRED EMBODIMENT OF THE INVENTION

Embodiments of the electronic member and the electronic device in accordance with the present invention will be explained in detail with reference to FIGS. 1 to 28.

Figure 1:
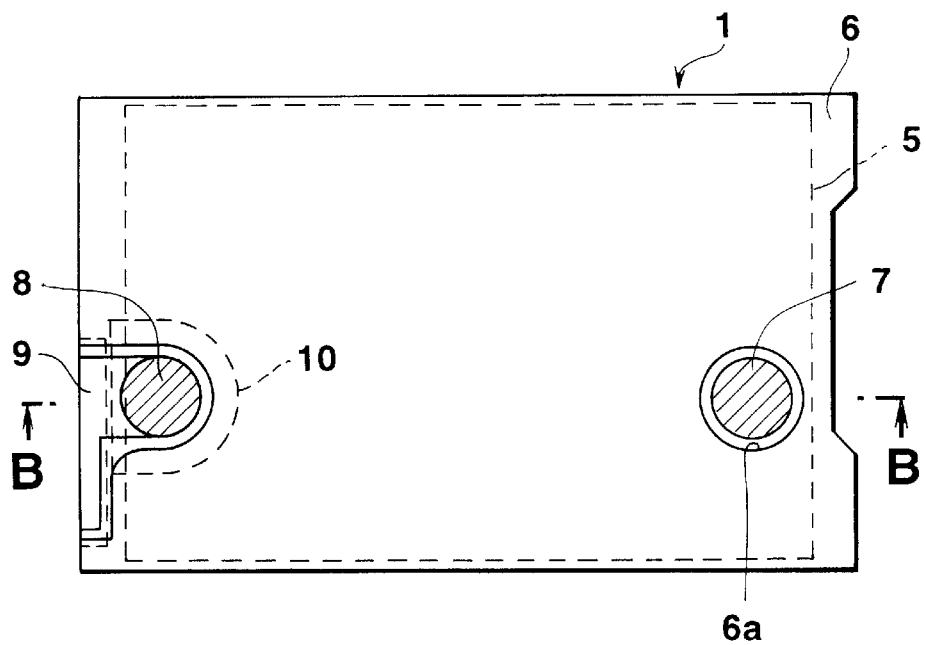
FIG. 1 is a bottom view of an electro luminescence element according to an embodiment of the electronic member of the invention.
Figure 2:
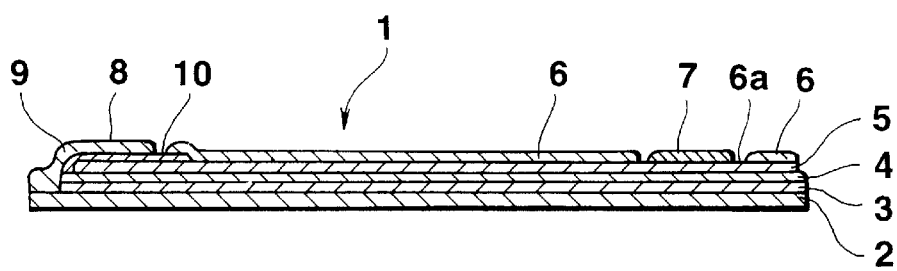
FIG. 2 is a cross-sectional view taken substantially along the line B—B shown in FIG. 1.

FIGS. 1 and 2 show one embodiment of the electronic member of the invention. The electronic member of the invention is applied to the electro luminescence element 1 in the embodiment.

An electro luminescence element 1 is formed by a front electrode 2 (i.e., second electrode), a luminescent layer 3, an intermediate insulation layer 4, a back electrode 5 (i.e., first electrode) and a back insulation layer 6, which are layered one another in order, as shown in FIGS. 1 and 2.

The luminescent layer 3 is formed in a rectangular plate-like and emits light by supplying electric power from a pair of the front electrode 2 and the back electrode 5. That is, an electronic member body of the electro luminescence element 1 comprises the luminescent layer 3. The front electrode 2, the intermediate insulation layer 4, the back electrode 5 and the back insulation layer 6 are also formed in a rectangular plate-like like the luminescent layer 3. As the result, the electro luminescence 1 comprising these layered members is a thin plate-like electronic member as a whole.

A back electrode connecting portion 7 (i.e., first electrode connecting portion) having a plate-like circular shape is connected with the back electrode 5 by being partially layered on the back electrode 5. The back electrode connecting portion 7 is provided on the back electrode 5 in a circular cutout 6a which is partially cut out of a back insulation layer 6 which was layered on the back electrode 5, in order to enable electrical connection to an external member.

A front electrode connecting portion 8 (i.e., second electrode connecting portion) which is paired with the back electrode connecting portion 7 is connected with the front electrode 2. The front electrode connecting portion 8 is formed by connecting a conductive portion 9 with the end of the front electrode 2 which is provided on an opposite side of back electrode connecting portion 7, leading the conductive portion 9 out to the surface of the back electrode 5, and positioning the led-out end portion of the conductive portion 9 in the region of the back electrode 5 in plan. The front electrode connecting portion 8, moreover, may be formed to have a circular plate-like shape. As the result, the front electrode connecting portion 8 is positioned on the same side of the back electrode 5 as the back electrode connecting portion 7, so that both electrode connecting portions 7 and 8 are positioned on the same side of the back electrode 5.

An insulation layer 10 is inserted between the front electrode connecting portion 8 and the back electrode 5, so that the front electrode connecting portion 8, that is, the front electrode 2 and the back electrode 5 is insulated by the insulation layer 10. Therefore, it is possible to surely supply electric power without short circuit between the electrodes 2 and 5.

The front electrode connecting portion 8 is partially stacked on the back electrode 5 which is stacked on the luminescent layer 3, so that the front electrode connecting portion 8 is positioned in the region of the luminescent layer 3, i.e., the member body in plan. The back electrode connecting portion 7 is also positioned in the region of the luminescent layer 3, i.e., the member body in plan, because the back electrode connecting portion 7 is stacked on the back electrode 5.

As described above, because a pair of the front electrode connecting portion 8 and the back electrode connecting portion 7 are positioned in the region of the luminescent layer 3 in plan, all electrode connecting portions 7 and 8 are positioned in the region of the luminescent layer 3 in plan, so that there is no portion extending out of the region of the luminescent layer 3 in plan. Accordingly, it is possible to make the shape of the external shape of the luminescent layer 3 coincide with the shape of the external shape of the electro luminescence element 1.

According to such a structure, it is possible to contain the whole of the electro luminescence element 1 in an apparatus case of an electronic apparatus, sufficiently, only with a space for containing the whole of luminescent layer 3. Therefore, because it is not necessary to enlarge the apparatus case, it is possible to miniaturize whole of the electronic apparatus.

Figure 3:
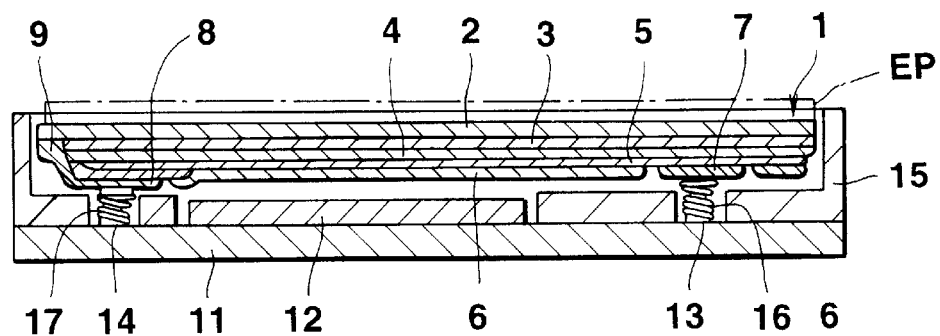
FIG. 3 is a cross-sectional view showing the attachment of the electro luminescence element to the circuit board.

FIG. 3 shows a structure of the electro luminescence element 1 described above. The electro luminescence element 1 is incorporated in the housing 15 so as to face to a circuit board 11. In the circuit board 11, a circuit pattern (which is not shown in FIGS. 1 and 2) is formed and a semiconductor chip 12 is attached thereto. The semiconductor chip 12 is for controlling the whole electronic apparatus including the electro luminescence element 1. Reference numerals 13 and 14 denote terminal portions for luminescence, which are portions of the circuit. One terminal portion 13 faces to the back electrode connecting portion 7 of the electro luminescence element 1, while the other terminal portion 14 faces to the front electrode connecting portion 8 thereof.

The electro luminescence element 1 and the circuit board 11 are positioned to face each other and are incorporated in the housing 15 which is made of insulating resin. The electro luminescence element 1 is incorporated in the housing 15, upside down of a state shown in FIG. 2. As the result, the back electrode connecting portion 7 faces to the one luminescent terminal portion 13, while the front electrode connecting portion 8 faces to the other luminescent terminal portion 14.

A coil spring 16 of wound conductive metal is inserted between the back electrode connecting portion 7 and the terminal portion 13, and a coil spring 17 is inserted between the front electrode connecting portion 8 and the terminal portion 14. Therefore, the back electrode connecting portion 7 and the terminal portion 13 are electrically connected with each other through the conductive coil spring 16, while the front electrode connecting portion 8 and the terminal portion 14 are electrically connected with each other through the conductive coil spring 17. The housing 15 has such a structure (not shown) to press down the electro luminescence element 1 to the circuit board 11 in order to prevent separation of the electro luminescence element 1 from the circuit board 11 by spring force of coil springs 16 and 17.

According to such an assembled structure, the luminescent layer 3 of electro luminescence element 1 emits light by inputting electric power supplied from the circuit board 11 to the whole of the electro luminescence element 1 through the conductive coil springs 16 and 17. As a result, it is possible to illuminate well another electronic member (not shown) such as a liquid crystal display panel EP or the like, which is arranged at an upper position of luminescent layer 3 by emitting light from the luminescent layer 3. According to such an assembled structure moreover, because the external shape and the size of external shape of the electro luminescence element 1 can be made small as described above, it is possible to miniaturize the assembled structure as a whole, sufficiently.

Figure 4:
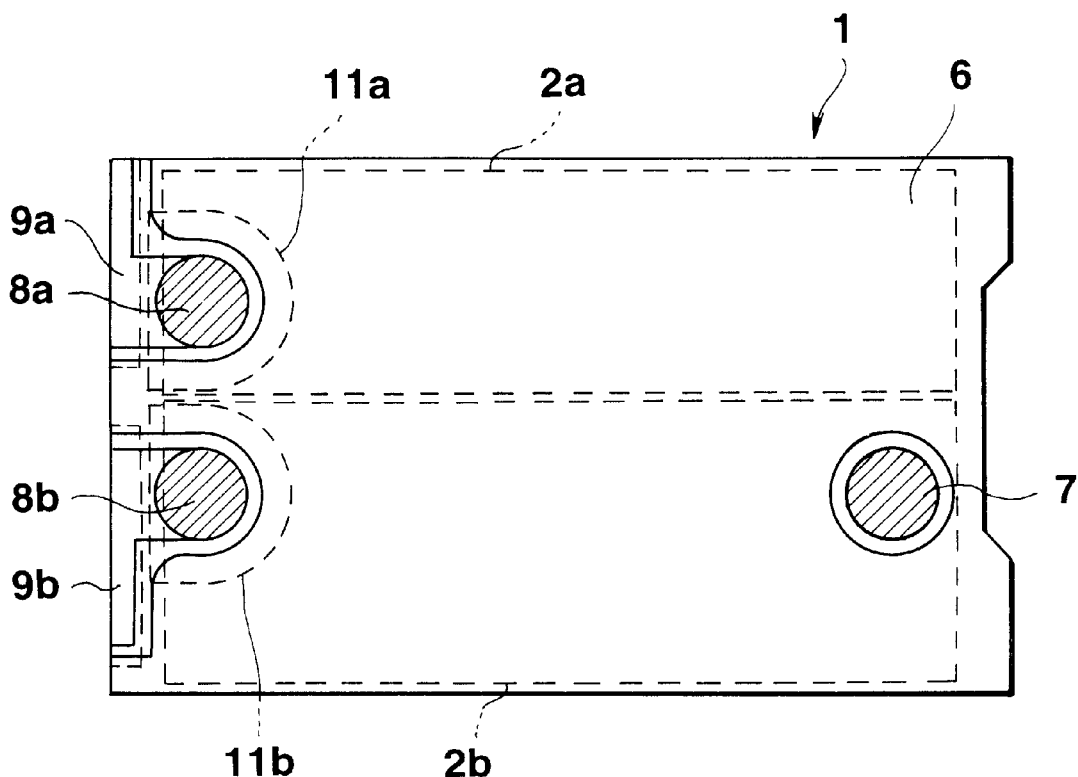
FIG. 4 is a bottom view of an electro luminescence element according to another embodiment.

FIG. 4 shows another embodiment wherein an electronic member of the invention is applied to the electro luminescence element 1.

In the electro luminescence element 1 of the embodiment, the front electrode 2 is divided into two portions and the two front electrode portions 2a and 2b are arranged in parallel with each other. Front electrode connecting portions 8a and 8b are connected with the front electrode portions 2a and 2b, respectively, as in the embodiment described above.

The connection is made by connecting the conductive portions 9a and 9b with the ends of the front electrode portions 2a and 2b, respectively, leading out the conductive portions 9a and 9b to the surface of the back electrode 5, and positioning the end of the led-out conductive portions 9a and 9b in the region of the back electrode 5 in plan, as in the embodiment described above. The front electrode connecting portions 8a and 8b may, as in the embodiment described above, be formed in plate-like circular shapes.

Insulation layers 11a and 11b are inserted between the front electrode connecting portions 8a and 8b and the back electrode 5 to insulate them.

According to the electro luminescence element 1 of the embodiment, because all electrode connecting portions which comprise the back electrode connecting portion 7 and the front electrode connecting portions 8a and 8b, are positioned in the region of the luminescent layer 3 in plan and there is no portion to extend in direction of the side of the luminescent layer 3, like the embodiment described above, it is possible to miniaturize the whole of the structure.

When electric power is inputted from two divided front electrodes 2a and 2b, because each portion of the luminescent layer 3, which is corresponding to the front electrodes 2a or 2b emits light independently, respectively, it is possible to make the two portions of luminescent layer 3 emit light separately and independently. As the result, various complicated form of light emission can be performed without enlarging the luminescent layer 3.

Although the front electrode is divided into two portions, the invention is not limited to this, and a division of the front electrode may be not less than three and the back electrode 5 may be divided similarly.

The invention is not limited to only an application to the electro luminescence element 1. The invention may be applied to any electronic member so long as it has plate-like device body, for example, a plate-like liquid crystal display element having a plate-like liquid crystal display portion as a body which displays, a plate-like photoelectric conversion element having a plate-like photoelectric converting portion as a body which performs photoelectric conversion, or another electronic members.

Figure 5:
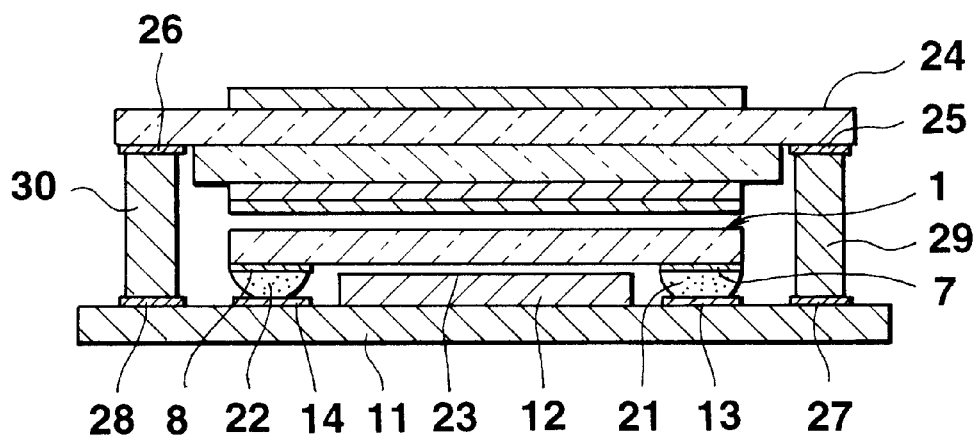
FIG. 5 is a cross-sectional view of an electronic device according to an embodiment of the invention.

FIG. 5 shows an embodiment of assembled structure in which the electro luminescence element 1 shown in FIGS. 1 and 2 is assembled.

In the embodiment, conductive projecting portions 21 and 22 which comprise conductive members are formed on the back electrode connecting portion 7 and the front electrode connecting portion 8, of the electro luminescence element 1, respectively, and the conductive projecting portions 21 and 22 are pressed against corresponded terminal portions 13 and 14 of the circuit board 11, respectively.

The conductive projecting portions 21 and 22 are formed on the back electrode connecting portion 7 and the front electrode connecting portion 8, of the electro luminescence element 1, respectively, previously before the electro luminescence element 1 is assembled. The electro luminescence element 1 is electrically connected with the circuit board 11 by pressing the conductive projecting portions 21 and 22 against the luminous terminal portions 13 and 14, of the circuit board 11. Therefore, connecting members such a coil spring, an interconnector or the like are not necessary to connect the electro luminescence element 1 and the circuit board 11, so that no work for incorporating the connecting members is required, thus the number of necessary members is reduced and the structure is simple.

Because no connecting members are required, no space for incorporating the connecting members is required between the electro luminescence element 1 and the circuit board 11. Therefore, it is possible to bring the electro luminescence element 1 near the circuit board 11 as close as possible, so that the electronic apparatus can be made thin.

The conductive projecting portions 21 and 22 are formed on the back electrode connecting portion 7 and the front electrode connecting portion 8 and have a height enough to have a spacing between the electro luminescence element 1 and the circuit board 11, so as not to be in contact with each other. In the embodiment, a semiconductor chip 12 is mounted on the circuit board 11 and has a height enough to form a space 23 between an upper surface of the semiconductor chip 12 and a lower surface of the electro luminescence element 1.

By providing the conductive projecting portions 21 and 22, having such height, the electro luminescence element 1 and the circuit board 11, that is, the semiconductor chip 12 are not in contact with each other when the electro luminescence 1 is assembled with the circuit board 11. Therefore, because it is not necessary to provide a spacer for preventing the contact of them or to form a housing having a structure for preventing the contacting, and therefore, it is possible to assemble the electro luminescence element 1 with the circuit board 11 easily.

The conductive projecting portions 21 and 22 can be formed by printing a conductive paste such as conductive silicone, conductive ink, silver paste or the like, or a conductive material such as solder or the like on the back electrode connecting portion 7 and the front electrode connecting portion 8 or by dropping the conductive material thereon. Because these operations are easy and carried out in short time, it is possible to carry out a processing to form the conductive projecting portions 21 and 22, easily.

The formation processing can be also carried out by previously producing the conductive projecting portions 21 and 22 separately by using a conductive metal or a conductive resin, thereafter by seizing or adhering the produced the conductive projecting portions 21 and 22 on the back electrode connecting portion 7 and the front electrode connecting portion 8. When the conductive projecting portions 21 and 22 are formed previously and separately, because a degree of freedom of forming becomes large, it is possible to easily produce the conductive projecting portions 21 and 22. Seizing can be performed by applying ultrasonic vibration or the like and adhering can be performed by using a conductive adhesive.

In the assembled structure shown in FIG. 5, a liquid crystal display device 24 is provided in an upper position of the electro luminescence element 1.

Electrodes 25 and 26 are formed on the lower surface of the liquid crystal display device 24, and are faced to display terminal portions 27 and 28 which are formed on the circuit board 11. The display terminal portions 27 and 28 are connected with the electrodes 25 and 26 which are facing thereto through interconnectors 29 and 30, respectively. As the result, the liquid crystal display device 24 carries out a predetermined display by inputting a signal from the circuit board 11. Because the electro luminescence element 1 illuminates the liquid crystal display device 24 by emitting light, user can recognize clearly the displayed information of the liquid crystal display device 24 even in the dark.

FIGS. 6 to 11 show embodiments to form a conductive projecting portion on the electro luminescence element 1, each structure of which is different from one another.

In these Figures, the electro luminescence element 1 are formed by a front electrode 2, a luminescent layer 3, an intermediate insulation layer 4, a back electrode 5 and a back insulation layer 6, which are layered in this order, like that of FIG. 2. A clear board 19 is layered on the front electrode 2.

Figure 6:
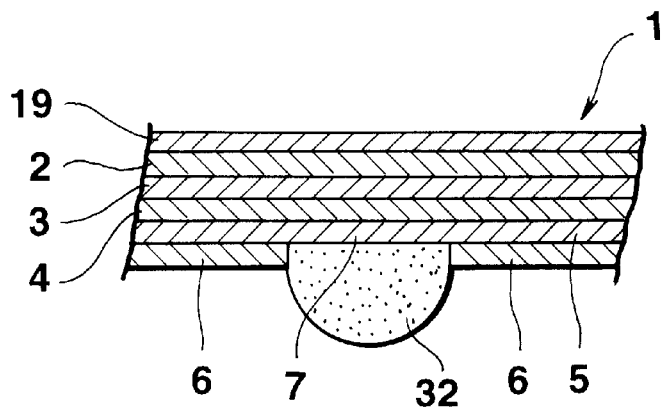
FIG. 6 is a partially sectional view of the electro luminescence element as an electronic member which is used in the electronic device.
Figure 7:
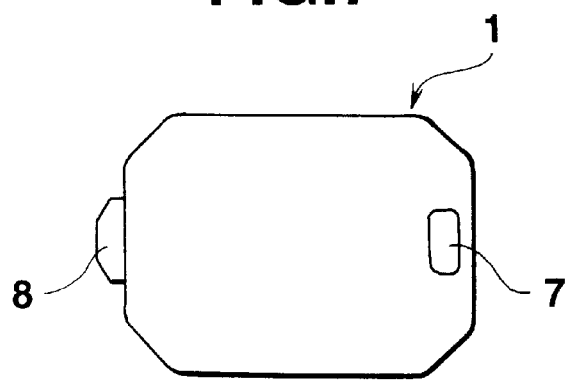
FIG. 7 is a bottom view of the electroluminescence element shown in FIG. 6.

In the embodiments shown in FIGS. 6 and 7, the back electrode 5 is positioned in the region of the electro luminescence element 1 in plan, while the front electrode 2 is positioned out of the region of the electro luminescence element 1, by the front electrode 2 extending outwardly. That is, the electro luminescence element 1 has a structure similar to a conventional electro luminescence element.

In the electro luminescence element 1, as shown in FIG. 6, a part of the back electrode 5 is exposed by cutting out a part of the back insulation layer 6, so that the exposed portion becomes the back electrode connecting portion 7. A conductive projecting portion 32 is formed on the back electrode connecting portion 7.

Because the conductive projecting portion 32 is formed so as to have enough height which is higher than the back insulation layer 6, which is attached by pressing to the luminous terminal portion 13 of the circuit board 11, as shown in FIG. 5, so that the electro luminescence element 1 is electrically connected with the circuit board 11.

In the front electrode 2 which is not shown, a conductive projecting portion 32 is formed on a front electrode connecting portion of the front electrode 2, like the above-described case. The conductive projecting portion 32 is formed in the same direction of the conductive projecting portion 32 of the back electrode 5, so that the front electrode 2 is electrically connected with the circuit board 11 through the conductive projecting portion 32.

Because the conductive projecting portion 32 is formed on the electro luminescence element 1 previously, it is possible to necessarily connect the electro luminescence element 1 with the circuit board 11 without a connecting member.

Because the conductive projecting portion 32 has a height enough to form a space between the electro luminescence element 1 and the circuit board 11, like the conductive projecting portions 21 and 22 shown in FIG. 5, it is possible to prevent the contact of the electro luminescence element 1 with the circuit board 11.

Figure 8:
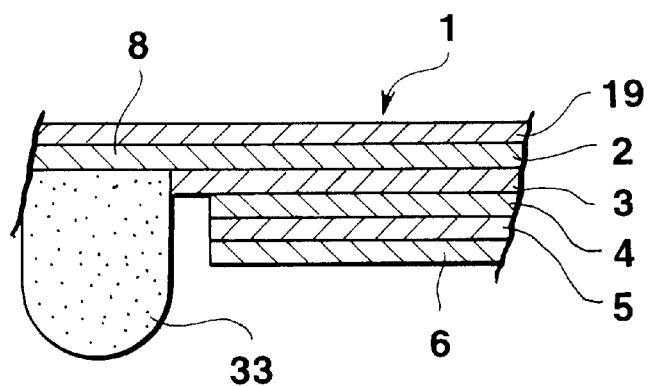
FIG. 8 is a partially sectional view of another electro luminescence element which is used in the electronic device.
Figure 9:
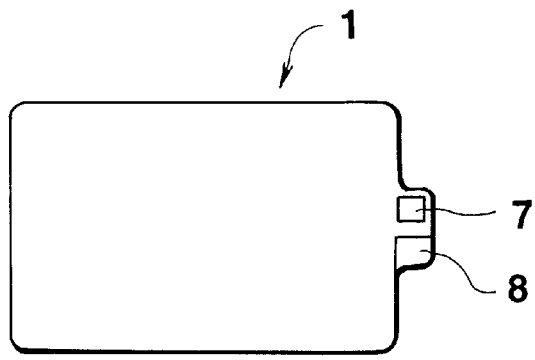
FIG. 9 is a bottom view of the electroluminescence element shown in FIG. 8.

In the embodiments shown in FIGS. 8 and 9, the back electrode connecting portion 7 and the front electrode connecting portion 8 are formed side by side on the portion which is extended out of the plate in plane. Conductive projecting portions are formed on the electrode connecting portions 7 and 8, respectively.

FIG. 8 shows that the conductive projecting portion 33 is formed on the front electrode connecting portion 8. By forming also the conductive projecting portion on the back electrode connecting portion, the electro luminescence element 1 is connected with the circuit board 11.

Figure 10:
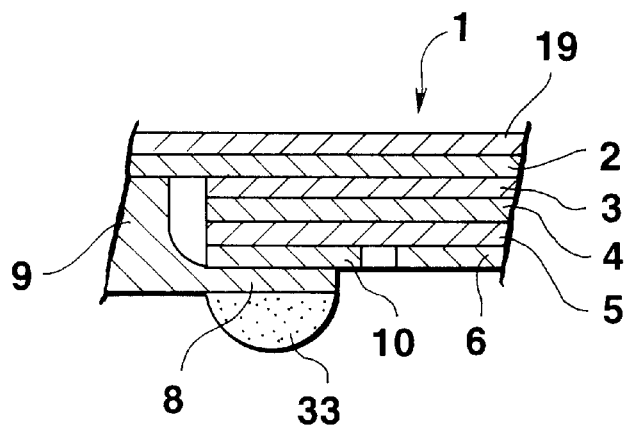
FIG. 10 is a partially sectional view of a further electro luminescence element which is used in the electronic device.
Figure 11:
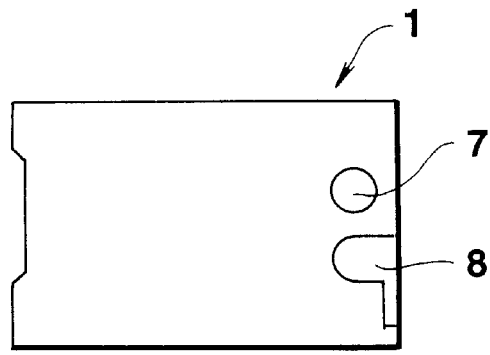
FIG. 11 is a bottom view of the electro luminescence shown in FIG. 10.

In the embodiments shown in FIGS. 10 and 11, the back electrode connecting portion 7 and the front electrode connecting portion 8 are formed in the region of the electro luminescence element 1 in plan.

The front electrode connecting portion 8 is formed in an extended edge portion of an extended conductive body 9 which is connected with the front electrode 2, as shown in FIG. 10. An insulation layer 10 is inserted between the front electrode connecting portion 8 and the back electrode 5.

The conductive projecting portion 33 is formed on the front electrode connecting portion 8, so that the electro luminescence element 1 is connected with the circuit board 11 through the conductive projecting portion 33.

Figure 12:
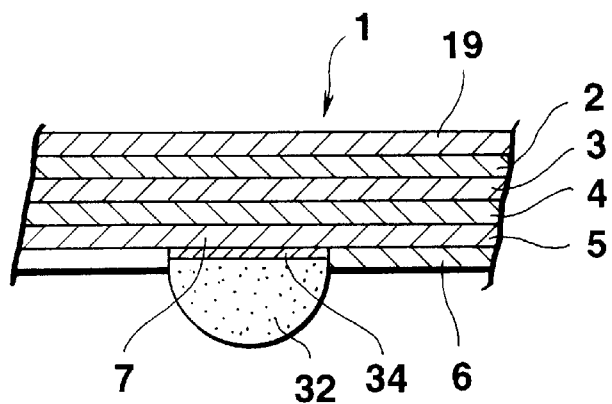
FIG. 12 is a partially sectional view of a modified embodiment of the electro luminescence element shown in FIG. 6.
Figure 13:
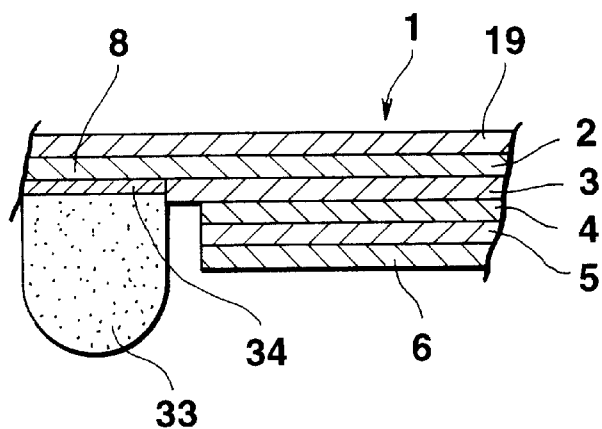
FIG. 13 is a partially sectional view of a modified embodiment of the electro luminescence element shown in FIG. 8.
Figure 14:
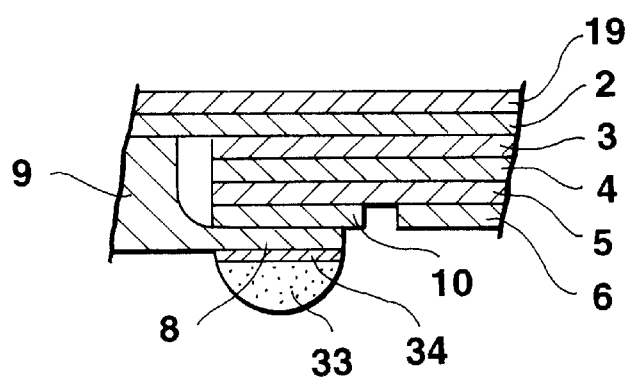
FIG. 14 is a partially sectional view of a modified embodiment of the electro luminescence element sown in FIG. 10.

FIGS. 12 to 14 show other embodiments of the conductive projecting portion. FIG. 12 corresponds to FIG. 6, FIG. 13 corresponds to FIG. 8, and FIG. 14 corresponds to FIG. 10.

In these embodiments, the conductive projecting portions 32 and 33 are attached to the back electrode connecting portion 7 or the front electrode connecting portion 8, through a sheet 34, respectively. A conductive sheet of double-coated or an anisotropy sheet of double-coated are used for the sheet 34, and the attachment can be carried out by adhering the sheet 34 to the electrode connecting portions 7 and 8, and thereafter, by adhering the conductive projecting portions 32 and 33 to the sheet 34.

According to the embodiment in which the conductive projecting portions 32 and 33 are attached through the sheet 34, it is possible to manufacture the conductive projecting portions 32 and 33 previously and easily. Further, it is possible to easily adjust a height of the conductive projecting portions 32 and 33 by changing the number of layers of the sheet 34.

Figure 15:
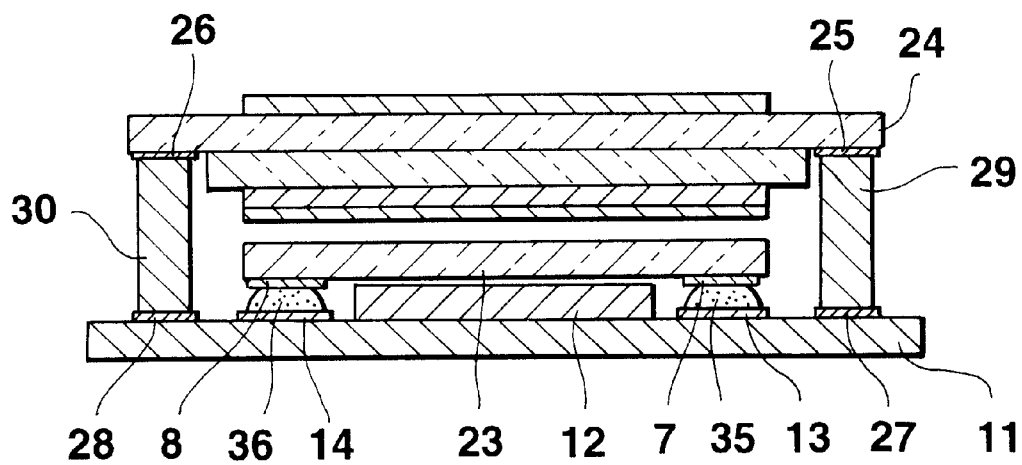
FIG. 15 is a cross-sectional view of another embodiment of the electronic device.
Figure 16:
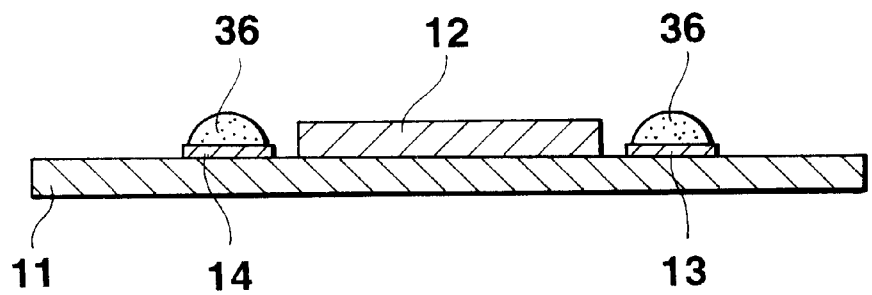
FIG. 16 is a cross-sectional view of the circuit board used for the electronic device shown in FIG. 15.
Figure 17:
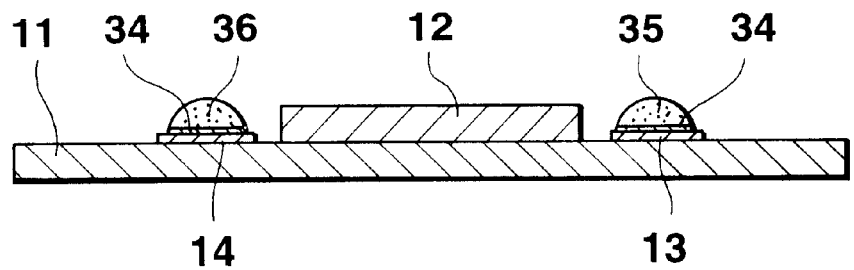
FIG. 17 is a cross-sectional view of another circuit board used for the electronic device shown in FIG. 15.

FIGS. 15 to 17 show another embodiment of an attached structure.

In the embodiment, conductive projecting portions 35 and 36 are formed on the circuit board 11. The conductive projecting portion 35 is formed on the luminous terminal portion 13 of the circuit board 11, while the conductive projecting portion 36 is formed on the luminous terminal portion 14, as shown in FIG. 16.

When the electro luminescence element 1 is assembled with the circuit board 11 thereon the conductive projecting portions 35 and 36 are formed, the circuit board 11 is connected with the electro luminescence element 1 through the conductive projecting portions 35 and 36, as shown in FIG. 15.

Therefore, it is not necessary to provide the connecting member between the circuit board 11 and the electro luminescence element 1, so that a connecting structure becomes simple and a work for attachment becomes easy. By setting the height of the conductive projecting portions 35 and 36 to form the space 23 between the circuit board 11, that is, a semiconductor chip 12 and the electro luminescence element 1, it is possible to prevent contact of the electro luminescence element 1 with the circuit board 11.

According to the embodiment, by attaching the sheet 34 such as the conductive sheet, the anisotropy sheet or the like to the luminous terminal portions 13 and 14 of the circuit board, it is possible to attach the conductive projecting portions 35 and 36 on the sheet 34, as shown in FIG. 17. Therefore, it is possible to easily adjust the height of the conductive projecting portions 35 and 36.

Figure 18:
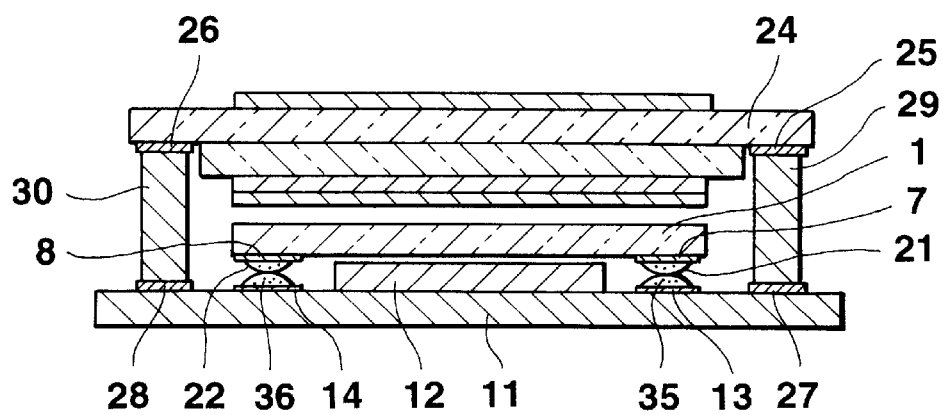
FIG. 18 is a cross-sectional view of a further embodiment of the electronic device.

FIG. 18 shows a further embodiment of the attached structure.

The conductive projecting portions 21 and 22 are formed on the electro luminescence element 1, while the conductive projecting portions 35 and 36 are formed on the circuit board 11. The conductive projecting portion 21 of the electro luminescence element 1 faces to the conductive projecting portion 35 of the circuit board 11, while the conductive projecting portion 22 faces to the conductive projecting portion 36, respectively.

When the electro luminescence element 1 is assembled with the circuit board 11, it is possible to electrically connect the circuit board 11 with the electro luminescence element 1 sufficiently, by the conductive projecting portions 21, 22, 35 and 36, facing to one another, being pressed against one another.

FIGS. 19 to 24 show a plate-like liquid crystal display device as an electronic member.

Figure 19:
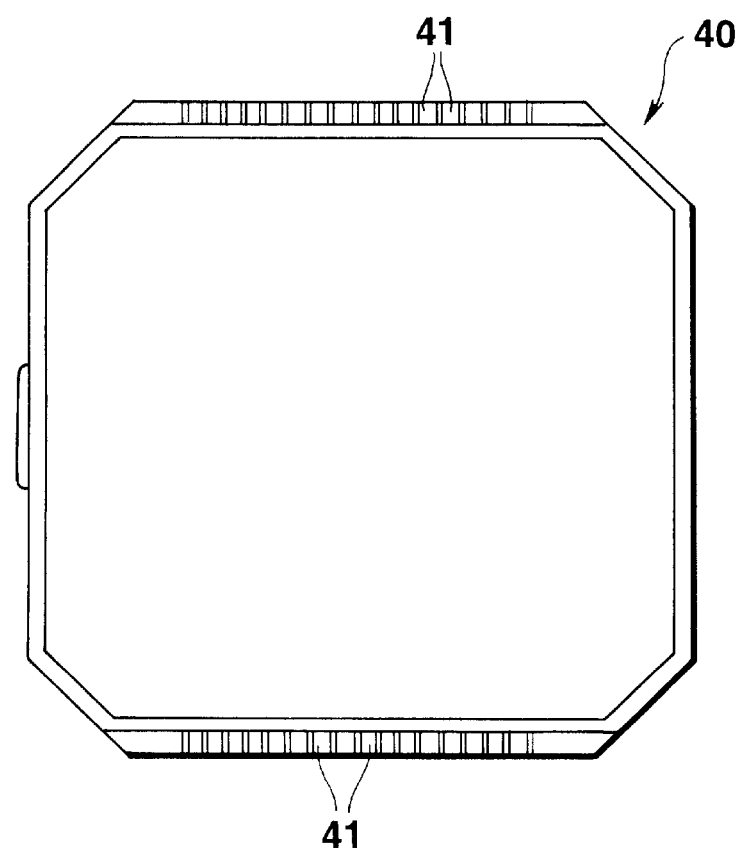
FIG. 19 is a plan view of a liquid crystal display device using glass substrates as an electronic member.
Figure 20:
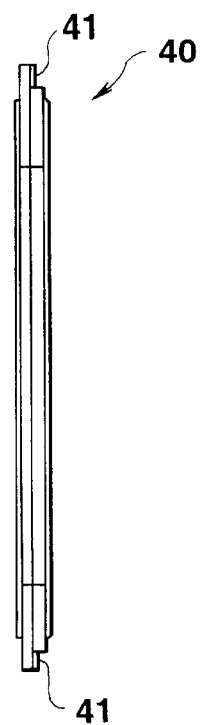
FIG. 20 is a side view of the liquid crystal display device using glass substrates shown in FIG. 19.
Figure 21:
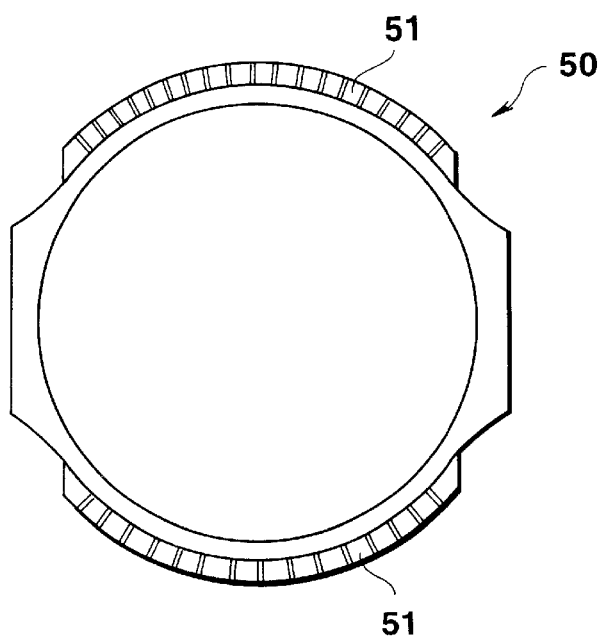
FIG. 21 is a plan view of a liquid crystal display device using film substrates.
Figure 22:
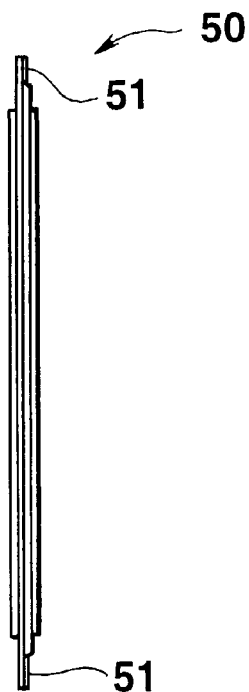
FIG. 22 is a side view of the liquid crystal display device using film substrates shown in FIG. 21.

FIGS. 19 and 20 show a liquid crystal display device 40 using glass substrates, while FIGS. 21 and 22 show a liquid crystal display device 50 using film substrates. According to the liquid crystal display devices 40 and 50, electrodes 41 and 51 are formed on the circumference thereof, so that the electrodes 41 and 51 are connected with the circuit board.

Figure 23:
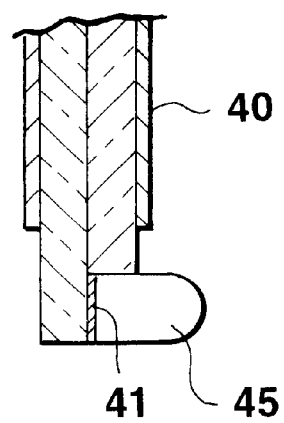
FIG. 23 is a partially sectional view of the liquid crystal display device using glass substrate.
Figure 24:
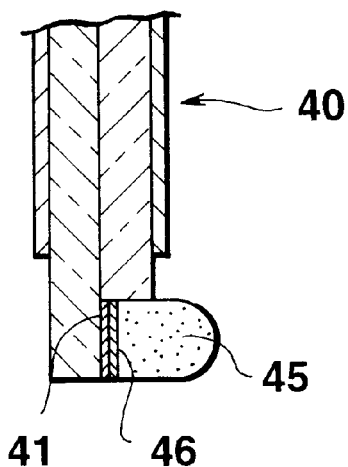
FIG. 24 is another partially sectional view of the liquid crystal display device using glass substrates.

According to the liquid crystal display devices 40 and 50, a conductive projecting portion 45 is formed on the electrodes 41 and 51. The conductive projecting portion 45 may be formed directly on the electrodes 41 and 51, as shown in FIG. 23, or the conductive projecting portion 45 may be connected with the sheet 46, such as the conductive sheet, the anisotropy sheet or the like which is attached to the electrodes 41 and 51, as shown in FIG. 24.

Even if the electrode 51 is curved like the liquid crystal display device 50 using films for substrates, because the conductive projecting portion 45 can be formed along the curving, it is possible to connect reliably without causing a contact failure.

Figure 25:
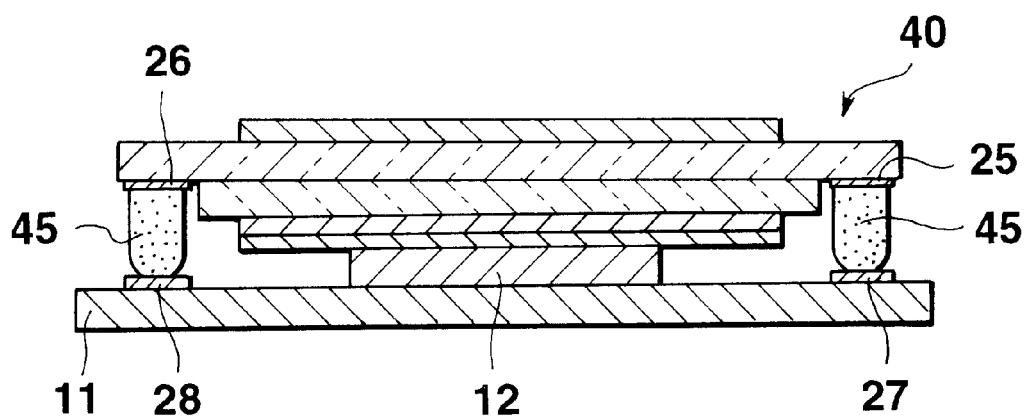
FIG. 25 is a cross-sectional view of a modified embodiment of the electronic device.
Figure 26:
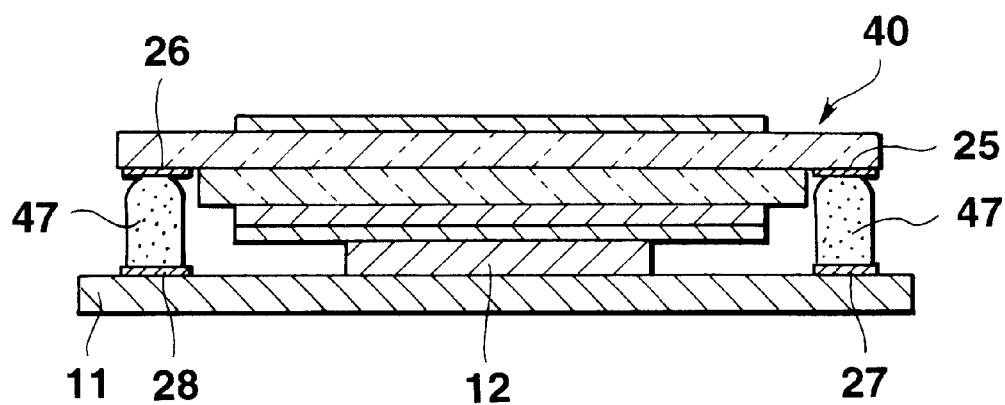
FIG. 26 is a cross-sectional view of another modified embodiment of the electronic device.
Figure 27:
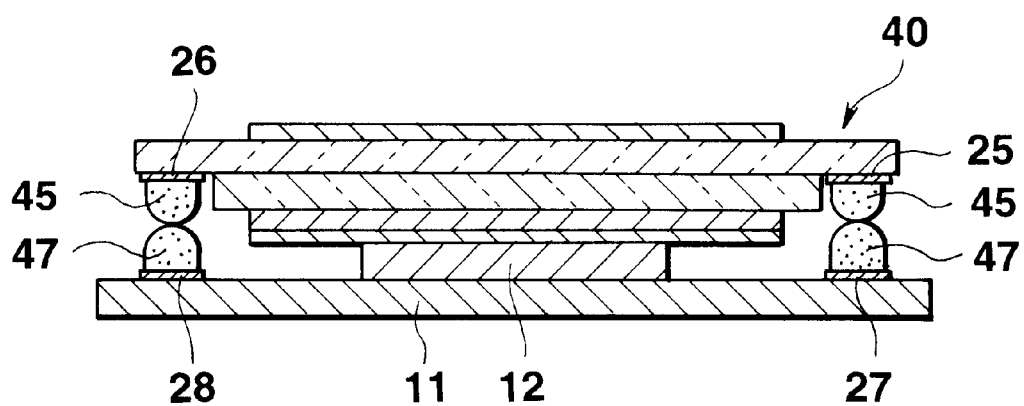
FIG. 27 is a cross-sectional view of a further modified embodiment of the electronic device.

FIGS. 25 to 27 show a structure in which the liquid crystal display device 40 using glass substrates, as an electronic member, is connected with the circuit board 11.

According to the structure shown in FIG. 25, the circuit board 11 is attached to the liquid crystal display device 40 using glass substrates through the conductive projecting portion 45 which is formed on the side of the liquid crystal display device 40 using glass substrates.

According to the structure shown in FIG. 26, the liquid crystal display device 40 using glass substrates is attached to the circuit board 11 through the conductive projecting portion 47 which is formed on the side of the circuit board 11.

According to the structure shown in FIG. 27, the conductive projecting portions 45 and 45 are formed on the side of the liquid crystal display device 40 using glass substrates, while the conductive projecting portions 47 and 47 are formed on the side of the circuit board 11, facing to each other.

According to these structures, it is possible to electrically connect the liquid crystal display device 40 using glass substrates with the circuit board 11 through the conductive projecting portions 45, 46 and 47, easily and sufficiently.

Figure 28:
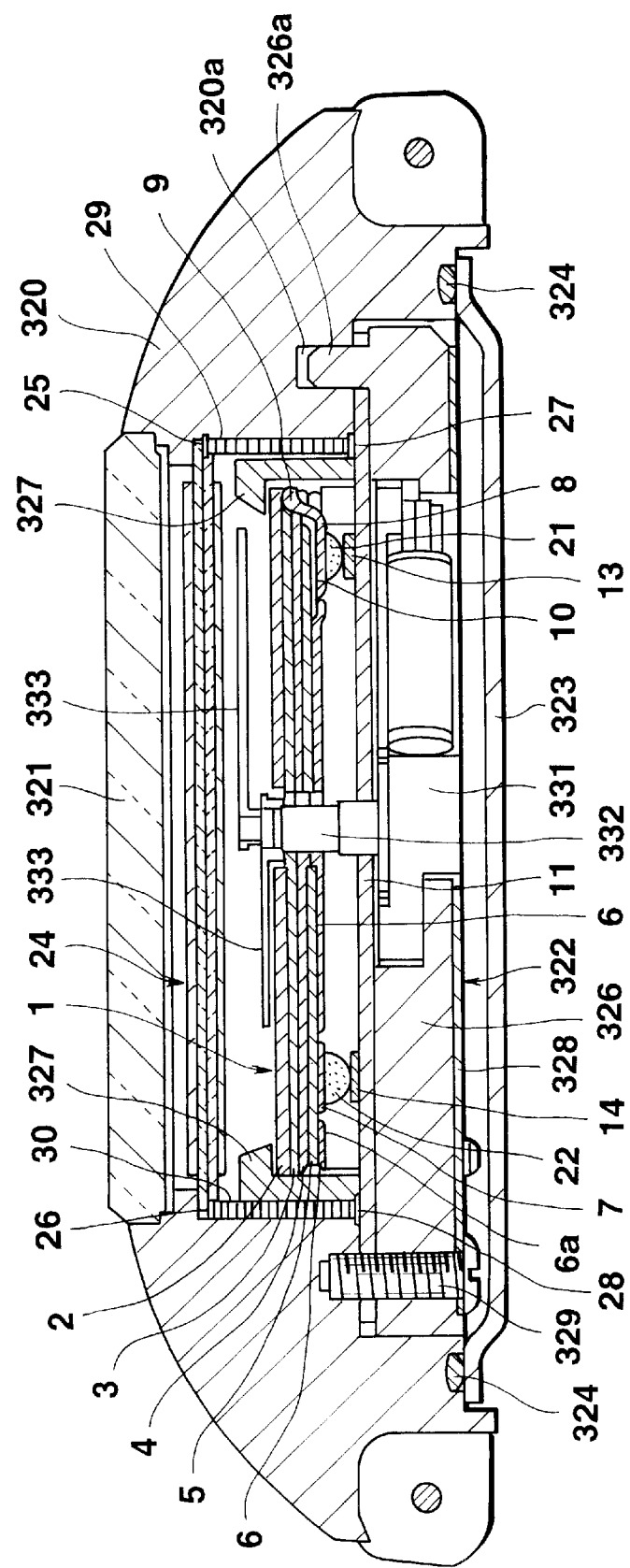
FIG. 28 is a cross-sectional view of an electronic wrist watch for which the invention is applied.

FIG. 28 is a cross-sectional view of an electronic watch to which the invention is applied.

The electro luminescence element 1 comprises the front electrode 2, the luminescent layer 3, the intermediate insulation layer 4, the back electrode 5, and the back insulation layer 6, which are layered one another in order, as shown in FIG. 28.

The luminescent layer 3 is formed in a rectangular plate-like and emits light by supplying electric power from a pair of the front electrode 2 and the back electrode 5. The body of electro luminescence element 1 comprises the luminescent layer 3. The front electrode 2, the intermediate insulation layer 4, the back electrode 5 and the back insulation layer 6 are also formed in a rectangular plate-like shape, like the luminescent layer 3. Therefore, the electro luminescence element 1 which comprises the layered these members is a thin plate-like electronic member as a whole.

The conductive projecting portions 21 and 22 which comprise conductive member are formed on the back electrode connecting portion 7 and the front electrode connecting portion 8, of the electro luminescence 1, respectively. Each of the conductive projecting portions 21 and 22 is pressed against the terminal portions 13 and 14, of the circuit board 11, respectively.

The conductive projecting portions 21 and 22 are previously formed on the back electrode connecting portion 7 and the front electrode connecting portion 8, of the electro luminescence 1 element 1, respectively, before the electro luminescence element 1 is assembled. By pressing the conductive projecting portions 21 and 22 against the terminal portion 13 and 14, of the circuit board 11, respectively, the electro luminescence element 1 is electrically connected with the circuit board 11.

In the assembled structure in FIG. 28, a liquid crystal display device 24 is provided in an upper surface of the electro luminescence element 1. The electrodes 25 and 26 are formed on a lower surface of the liquid crystal display device 24, which are facing to the display terminal portions 27 and 28 which are formed on the circuit board 11. The display terminal portions 27 and 28 are connected with the electrodes 25 and 26, which are facing to one another, through interconnectors 29 and 30, respectively, so that the liquid crystal display device 24 carries out a predetermined display by inputting a signal from the circuit board 11. Because the electro luminescence element 1 illuminates by emitting light for the liquid crystal display device 24, it is possible to recognize the displayed information of the liquid crystal display device 24 even in the dark.

As shown in FIG. 28, a watch glass 321 is attached on an upper surface of the case 320, while a case back 323 is attached on a lower surface of the case 320 through a waterproof ring 324. In an interior of the case 320, an watch module 322 is provided.

The watch module 322 comprises the circuit board 11, an analog movement 331, the electro luminescence element 1 above-described and a housing 326 (a lower housing) to incorporate these members. The housing 326 is positioned in the case 320 by fitting a positioning projection 326a formed as a body into a positioning hole 320a of the case 320. When a circuit supporter 328 is brought into contact with the lower surface of the housing 326, the watch module 322 is mounted in the case 320 by a screw 329 penetrating the housing 326 and the circuit supporter 328, and screwing a top edge thereof into the case 320.

The circuit board 11 is attached on the housing 326. The electro luminescence element 1 is mounted in the housing 326 by pressing down a circumference portion by a parting member 327 extending upwardly from the housing 326.

The analog movement 331 is contained in the housing 326. The analog movement 331 comprises a hand shaft 332 which penetrates the center of the circuit board 11 and the electro luminescence element 1 to project to upper side thereof. Hands 333 which comprises a hour hand, a minute hand and a second hand are attached to the hand shaft 332. According to the electronic watch, the liquid crystal display device 24 displays information as time, a date, a day of the week or the like.

According to the electronic wrist watch, because the electrode connecting portions 7 and 8 of the electro luminescence element 1 are provided on a surface of the back electrode 5, it is possible to miniaturize the size of the external shape of the electro luminescence element 1, thereby whole of the case complete 320 for containing the electro luminescence element 1 can be miniaturized sufficiently.

Because the electro luminescence element 1 is connected with the circuit board 11 through the conductive projecting portions 21 and 22 which are formed previously, no other member for connecting are required. Therefore, it is possible to simplify a connecting structure and to carry out the work of connecting easily.

The invention may be applied for a plate-like electronic member like a photoelectric converting device of plate-like solar battery or the like, a plate-like touch panel, plate-like various censors or another electronic member.

As described above, the electronic member according to an embodiment of the invention comprises: the plate-like electronic member body (3 and 4 in FIG. 2); the first and second electrodes (5 and 2 in FIG. 2) which are formed on the first surface and the other second surface of the electronic member body, respectively; the first electrode connecting portion (7 in FIG. 2) which is formed on the first electrode (5 in FIG. 2); the second electrode connecting portion (8 in FIG. 2) which is electrically connected with the second electrode (2 in FIG. 2) and which is formed on a same side of the first electrode (5 in FIG. 2) as the first electrode connecting portion; and the insulating layer (10 in FIG. 2) interposed between the first electrode and the second electrode connecting portion, as shown in FIGS. 1 and 2.

The electronic device according to an embodiment of the invention comprises the electronic member (1 in FIG. 2) and the apparatus case (15 in FIG. 2) having the electronic member built-in, as shown in FIG. 3.

As shown in FIG. 4, in the above-described electronic member, one or both of the first and second electrodes is divided into a plurality of electrode portions (2a and 2b in FIG. 4) and the electrode connecting portions (8a and 8b in FIG. 4) are provided for each divided electrode portion. As shown in FIGS. 2 and 5, the electronic member body comprises one selected from the group consisting of the plate-like luminescent element (3 in FIG. 2), the liquid crystal display element (24 in FIG. 5) and the photoelectric converting element.

The electronic device according to an embodiment of the invention comprises: the circuit board (11 in FIG. 5) having the electrically connecting portions (13 and 14 in FIG. 5); the electronic member (1 in FIG. 5) which is arranged to face the circuit board and has the electrodes (7 and 8 in FIG. 5)

formed at a position corresponding to the connecting portions; and the conductive projecting portions (21 and 22 in FIG. 5) which are formed on at least one of the electrodes and the connecting portion, to electrically connect the electrodes of the electronic member with the connecting portions of the circuit board, as shown in FIG. 5.

The electronic device according to an embodiment of the invention comprises the electronic member (1 in FIG. 5) and the display device (24 in FIG. 5) provided above the electronic member, as shown in FIG. 5.

The electronic device according to an embodiment of the invention comprises: the electronic member (1 in FIG. 28) comprising the plate-like electronic member body (3 and 4 in FIG. 28), the pair of first and second electrodes (5 and 2 in FIG. 28) which are formed on both surfaces of the electronic member body, and the pair of first and second electrode connecting portions (7 and 8 in FIG. 28) which are disposed on a same side of the first electrode (5 in FIG. 28) between the pair of first and which are electrically connected with the pair of first and second electrodes, respectively, wherein the second electrode connecting portion (8 in FIG. 28) is formed on the first electrode with the insulating layer (10 in FIG. 28); the circuit board (11 in FIG. 28) disposed therebetween which is disposed to face the electronic member and has the pair of terminal portions (13 and 14 in FIG. 28) formed to face the pair of electrode connecting portions; and the conductive projecting portions (21 and 22 in FIG. 28) which are formed on at least one of the electrode connecting portions of the electronic member and the terminal portions of the circuit board, to electrically connect the electrode connecting portions with the terminal portions, as shown in FIG. 28.

The electronic apparatus according to an embodiment of the invention comprises the electronic device (1 in FIG. 28) and the apparatus case (320 in FIG. 28) having the electronic device built-in.

In the above-described electronic device, the predetermined space is formed between the electronic member and the circuit board, and the conductive projecting portions are formed in the space. The conductive projecting portions are formed by one selected from the group of methods consisting of printing, dropping, seizing and adhering. And the conductive projecting portions are formed on the electrode connecting portions of the electronic member or the terminal portion of the circuit board, through the conductive sheet or anisotropy sheet (34 in FIGS. 13 and 14). The electronic member comprises one selected from the group consisting of the luminescent member, the liquid crystal display member and the photoelectric converting member.

What is claimed is:

1. An electronic device comprising:

a circuit board having an electrically connecting portion;

an electronic member which is arranged to face the circuit board and which has an electrode formed at a position corresponding to the connecting portion; and a conductive projecting portion which is formed on the connecting portion so as to electrically connect the electrode of the electronic member with the connecting portion of the circuit board.

2. An electronic device comprising:

an electronic member comprising a plate-like electronic member body, a pair of first and second electrodes which are formed on both surfaces of the electronic member body, and a pair of first and second electrode connecting portions which are disposed on a same side of the first electrode and which are electrically connected with the pair of first and second electrodes, respectively, wherein the second electrode connecting portion is formed on the first electrode with an insulating layer disposed therebetween;

a circuit board which is disposed to face the electronic member and which has a pair of terminal portions formed to face the pair of electrode connecting portions; and conductive projecting portions which are formed on the terminal portions of the circuit board so as to electrically connect the electrode connecting portions with the terminal portions.

3. An electronic apparatus comprising an apparatus case having an electronic device built-in, the electronic device comprising:

a circuit board having an electrically connecting portion;

an electronic member which is arranged to face the circuit board and which has an electrode formed at a position corresponding to the connecting portion; and a conductive protecting portion which is formed on the connecting portion so as to electrically connect the electrode of the electronic member with the connecting portion of the circuit board.

\* \* \* \* \*